(12) United States Patent
Driemel et al.

(10) Patent No.: US 7,990,147 B2
(45) Date of Patent: Aug. 2, 2011

(54) SYSTEM AND METHOD FOR ELECTRICALLY CONTACTING LOCAL COILS WITH A SIGNAL PROCESSOR REMOTE THEREFROM IN A MAGNETIC RESONANCE SCANNER

(75) Inventors: Daniel Driemel, Öderan (DE); Oliver Heid, Gunzenhausen (DE); Thomas Kundner, Buckenhof (DE)

(73) Assignee: Siemens Aktiengesellschaft, Munich (DE)

( * ) Notice: Subject to any disclaimer, the term of this patent is extended or adjusted under 35 U.S.C. 154(b) by 225 days.

(21) Appl. No.: 12/486,934

(22) Filed: Jun. 18, 2009

(65) Prior Publication Data
US 2009/0315556 A1    Dec. 24, 2009

(30) Foreign Application Priority Data

Jun. 18, 2008  (DE) .......................... 10 2008 028 919

(51) Int. Cl.
*G01V 3/00* (2006.01)
(52) U.S. Cl. ...................................... 324/318; 324/309

(58) Field of Classification Search .......... 324/300–322; 600/407–445
See application file for complete search history.

(56) References Cited

U.S. PATENT DOCUMENTS

| | | | | |
|---|---|---|---|---|
| 6,157,193 | A * | 12/2000 | Renz et al. .................... | 324/318 |
| 7,330,030 | B2 * | 2/2008 | Nakabayashi ................ | 324/318 |
| 7,602,182 | B2 * | 10/2009 | Heid et al. .................... | 324/307 |
| 2008/0197849 | A1 | 8/2008 | Heid et al. | |

* cited by examiner

*Primary Examiner* — Brij B Shrivastav
(74) *Attorney, Agent, or Firm* — Schiff Hardin LLP (57) ABSTRACT

In a contacting system and method for contacting magnetic resonance local coils with a unit for additional signal processing of a magnetic resonance data acquisition unit, a number of coil coupler elements are electrically connected with the magnetic resonance local coils and apparatus coupler elements are mounted at the magnetic resonance tomograph, and are electrically connected with a unit for signal processing. The coil coupler elements and the apparatus coupler elements are fashioned so that, given a movement of the local coils along a movement path in the magnetic resonance data acquisition unit, a successive contacting of at least a portion of the coil coupler elements with apparatus coupler elements ensues at least over a specific path segment of the movement.

22 Claims, 7 Drawing Sheets

SYSTEM AND METHOD FOR ELECTRICALLY CONTACTING LOCAL COILS WITH A SIGNAL PROCESSOR REMOTE THEREFROM IN A MAGNETIC RESONANCE SCANNER

BACKGROUND OF THE INVENTION

1. Field of the Invention

The present invention concerns a contacting system and a method for contacting magnetic resonance local coils with a unit for additional signal processing of a magnetic resonance tomography apparatus, as well as a magnetic resonance tomograph with such a contacting system.

2. Description of the Prior Art

To examine a part of a human body it is known to introduce the body part to be examined into a homogenous magnetic field, known as the basic field. The magnetic field produces an alignment of the nuclear spins of atomic nuclei in the body part, in particular of atomic hydrogen nuclei (protons) bound to water. By means of radio-frequency excitation pulses, these nuclei are excited to a precession movement. After the end of an excitation pulse, the atomic nuclei precess with a frequency that depends on the strength of the basic field and then settle down again into the preferred direction predetermined by the basic field after a predetermined relaxation time due to their spins. The atomic nuclei thereby emit radio-frequency signals (known as magnetic resonance signals).

Through computational or measurement-related analysis of the integral magnetic resonance signals, an image can be generated from the spatial spin density or the distribution of the relaxation times within a body slice of an image. The association of the magnetic resonance signals (which can be tracked as a result of the precession movement) with the respective location of its generation ensues via application of linear field gradients. For this purpose, the corresponding gradient fields are superimposed on the basic field and controlled, and such that an excitation of the nuclei ensues only in a slice to be imaged. An image depiction based on these physical effects is known as "magnetic resonance tomography".

For the most part, local surface coils (local coils)—also known as "loop antennas"—or array arrangements constructed from such loop antennas are used to acquire the magnetic resonance signals of an examination subject.

The magnetic resonance signals generated by the excited atomic nuclei induce a voltage in the reception antenna, which voltage is then amplified as an acquired magnetic resonance signal in a low-noise preamplifier, and are conducted via a cable to an additional amplifier device. The magnetic resonance signals—which are thus amplified twice—are then relayed via a further line to a unit for additional signal processing, via which unit they are processed further. Such a unit for additional signal processing is thus an electronic receiver unit that accepts the signals acquired by the local coils and prepares them—in particular amplifies and demodulates them—so that raw image data are created in a suitable form. Based on the raw data, volume image data and/or slice image data of an examination subject can then be reconstructed, normally with the assistance of additional processing units.

As mentioned, a preamplifier for amplification of the signals (that are then relayed via conductors and plugs with the additional processing unit) is conventionally located in every magnetic resonance local coil. Given a coverage of larger examination subjects from top to bottom with a plurality of magnetic resonance local coils, and/or given a use of multi-channel arrays, a correspondingly large number of conductors and plugs as well as units for additional signal processing or input channels into multi-channel units for additional signal processing are required. The number of units for additional signal processing or input channels in multi-channel units for additional signal processing is normally already limited for cost reasons.

Therefore, advantageously only those magnetic resonance local coils that are presently located in the acquisition field (field of view) of the magnetic resonance scanner are therefore connected to continuative electronic components. This creates the problem that the magnetic resonance local coils must each be coupled and decoupled again during the passage of an examination subject through the scanner.

Given such a passage, the movement of a subject positioning device therefore must be implemented discontinuously (for example clocked) in order to have the opportunity for recoupling. This significantly slows the examination workflow.

SUMMARY OF THE INVENTION

An object of the present invention is to provide a simplified arrangement for contacting magnetic resonance local coils with a unit for additional signal processing in a magnetic resonance tomography apparatus, which simplified arrangement also enables a continuous movement of a subject positioning device.

The contacting system according to the invention has a number of coil coupler elements that are electrically connected with the magnetic resonance local coils and apparatus coupler elements that are mounted on the magnetic resonance scanner housing and are electrically connected with the unit for additional signal processing. The coil coupler elements and the apparatus coupler elements are fashioned so that, given a movement of the local coils along a movement distance in the magnetic resonance scanner, a successive contacting of at least a portion of the coil coupler elements with apparatus coupler elements ensues at least over a specific path segment.

Instead of as conventionally—via fixed contact connections or via plug contacts—the contacting, which enables a signal transmission of measurement signals of the magnetic resonance local coils to the unit for additional signal processing, ensues via coil and apparatus coupler elements that do not need to be permanently mechanically connected with one another. The contacting can consequently ensue automatically (i.e. without the necessity of an outside intervention in the magnetic resonance tomograph) during a running magnetic resonance scan in which an examination subject is moved through the patient space and scanned.

Moreover the preamplifiers thus no longer necessarily need to be integrated into the local coil. Therefore the preamplifiers are arranged after the apparatus coupler elements in the apparatus, preferably relatively close after the apparatus coupler elements, and are also oily hooked up to the respective local coils via the contacting. This is possible since very long cables for contacting the local coils can be foregone. Power supply to the local coils is therefore also superfluous. However, insofar as local coils with integrated preamplifiers and/or control elements are used as before, not only the signal lines but also the power supply lines for the preamplifiers and/or other control lines for the local coil can be contacted in the manner according to the invention.

In the method according to the invention for contacting magnetic resonance local coils with a unit for additional signal processing of the magnetic resonance tomography apparatus, given a movement of the magnetic resonance local coils along the movement path in the magnetic resonance tomography scanner, a successive contacting of at least a portion of the coil coupler elements with apparatus coupler elements ensues at least over a specific path segment by the use of coil coupler elements that are electrically connected with the magnetic resonance local coils and apparatus coupler elements that are mounted at the magnetic resonance scanner housing and are electrically connected with the unit for additional signal processing.

Within the scope of the invention, the movement path is advantageously a path over which an examination subject is transported relative to the scanner of the magnetic resonance tomography apparatus, i.e. a straight track with horizontal movement direction in and through the measurement space (normally a patient tunnel) or a laterally open U-shaped space) of the magnetic resonance tomograph. The examination subject can thereby be moved in the direction of the tomograph and the tomograph can be moved in the direction of the examination subject.

The invention furthermore encompasses a magnetic resonance tomography apparatus with a contacting system according to the invention.

The present invention also encompasses a contacting system, and a magnetic resonance apparatus embodying such a contact system, that operate according to the method and all embodiments described above.

The coil coupler elements are preferably mounted on a subject positioning device by means of which the magnetic resonance local coils are entrained in operation. Such a subject positioning device is typically designated as a patient table, but this does not mean that only patients as examination subjects can be supported thereupon. The coil coupler elements are typically placed on and/or below the examination subject, or can be directly mounted on such a patient table, so that a movement of the patient table automatically also necessitates a movement of the coil coupler elements. The coil coupler elements can be firmly connected with the patient table and, for example, be connected via plugs integrated into the patient table with magnetic resonance local coils that can be freely placed on an examination subject.

In a further embodiment of the invention, the coil coupler elements and the apparatus coupler elements are fashioned and arranged so that those respective coil coupler elements are contacted whose associated magnetic resonance local coils are located in operation in an acquisition region of the scanner. The acquisition region (also called "field of view") is the region in which the scanner most effectively operates to conduct measurements for image data acquisition. This is normally a middle region of the patient tunnel in which the fields for excitation and acquisition of the magnetic resonance signals are particularly homogeneous. Therefore, at least a significant portion of the magnetic resonance local coils that are presently located in the field of view must be connected with the unit for additional signal processing.

Since the magnetic resonance local coils that are located outside of the field of view do not contribute to the raw data acquisition, these do not have to be connected with the unit for additional signal processing. Since the channel count (number of reception channels) of the unit for additional signal processing is limited, the contacting system is advantageously fashioned so that only precisely those magnetic resonance local coils that are located in the field of view are contacted.

For this purpose, the coil coupler elements and/or the apparatus coupler elements are preferably fashioned and arranged so that the coupling of a particular coil coupler element (which coil coupler element is associated with a magnetic resonance local coil) with an apparatus coupler element ensues just before or upon entrance of that magnetic resonance local coil into the acquisition region of the magnetic resonance scanner. Analogously, as an alternative or in addition, the coil coupler elements and/or the apparatus coupler elements are fashioned and arranged such that a cancellation of the coupling of a coil coupler element (which coil coupler element is associated with a magnetic resonance local coil) with an apparatus coupler element ensues just after or upon exit of the magnetic resonance local coils from the acquisition region of the magnetic resonance scanner.

Within the framework of the entrance of a magnetic resonance local coil into the field of view and/or such a decoupling within the framework of its exit from the same, such a coupling means that coupling capacitances can be optimally utilized: the coupling in the field of view is important—if not always inevitable within the entire field of view—but a coupling outside of the field of view would only be a waste of coupling resources. These resources are therefore best used when no coupling occurs outside of the field of view.

This can be translated into practice through a suitable dimensioning and arrangement of the coil and/or apparatus coupler elements in relation to the arrangement of the magnetic resonance local coils. As is explained below using an example, for this purpose the coupler elements do not necessarily have to be equal in size or approximately the size of the acquisition region of the magnetic resonance local coils. Rather, the key to this effect lies in the combination of dimensioning and arrangement of the coupler elements.

The coil coupler elements can advantageously lie on a vertical line perpendicular to the movement direction, which vertical line runs through the magnetic resonance local coils. In other words, the magnetic resonance local coils and the coil coupler elements are then arranged directly over or under one another or next to one another. This arrangement alone is not sufficient to achieve the aforementioned effect of the coupling and decoupling upon entering and exiting the field of view, but alone it is already advantageous because with it an association of magnetic resonance local coils and the coil coupler elements associated with them is possible in a simple manner. Alternatively, in the arrangement an offset of the coil coupler elements in or contrary to the movement direction can also be provided, with the distances (spacings) between the coil coupler elements and the magnetic resonance local coils associated with them preferably each remaining equal.

In principle, the contacting of the coupler elements can ensue in practically any arbitrary manner, for example even via optical signal transmission. However, the coil coupler elements and the apparatus coupler elements are preferably designed for galvanic and/or capacitive and/or inductive contacting. Among other things, galvanic coupling has the advantage that a signal transmission ensues without conversion into other form of signal medium, and contacting is technically established simply via physical contact. In a simplest variant, galvanic coupler elements can be executed as slip contacts that are moved relative to one another, for example, wherein one type of coupler elements is fashioned like a brush so that the brushes can be directed sliding over surfaces of the other type of coupler elements.

In contrast to this, capacitive and inductive systems for example have the advantage that they operate without contact, and therefore there exists no danger of wear and abrasion of the coupler elements.

A very advantageous type of capacitive contacting is used in a further embodiment wherein the coil coupler elements and the apparatus coupler elements respectively possess at least two capacitor surfaces or capacitor plates acting in parallel, which respectively form a capacitor group, in particular a capacitor pair. A capacitor surface of a coil coupler element together with an oppositely situated capacitor plate of an apparatus coupler element (which capacitor plate is associated with the appertaining capacitor surface) thereby form a capacitor of the capacitor group or the capacitor pair. The respective interacting capacitor surfaces or capacitor plates of a capacitor group (or, capacitor pair) are then fashioned and arranged relative to one another so that a capacitance change of a capacitor of the capacitor group, that is produced by a relative movement between coil coupler elements and apparatus coupler elements perpendicular to the capacitor plates, is compensated again by a capacitance change of at least one other capacitor of the capacitor group that is likewise inevitably caused by the appertaining movement.

Such an arrangement or circuit has the advantage that one coupler element moves between parts of the other coupler element, and therefore the distance from the first coupler element to the two parts of the second coupler element does not need to be kept exactly constant (as this is otherwise necessary given capacitive signal transmission).

For the successive coupling of apparatus and coil coupler elements, a movement of various components of the magnetic resonance scanner is necessary. This movement is preferably a continuous movement in order to not unnecessarily delay workflows. As mentioned above, such a continuous movement is presently possible only with the method according to the invention when all magnetic resonance local coils should not be permanently contacted. The magnetic resonance local coils are preferably moved continuously with the coil coupler elements and/or the apparatus coupler elements. However, it is also implied that a subject positioning unit is likewise continuously entrained.

The movement of the coil and apparatus coupler elements can in principle ensue on the basis of two alternative methods: either the coil coupler elements and the apparatus coupler elements are moved relative to one another, or they are moved with one another, preferably uniformly with one another or parallel to one another. The first variant means that either the apparatus coupler elements are directed past the coil coupler elements or vice versa. The second variant provides a combined movement of both coupler elements over a specific distance. The advantages of the two alternatives primarily result depending on construction design of the respective magnetic resonance tomograph. Generally stated, a movement of the coupler elements relative to one another affords the possibility of simpler designs and smaller structural height of the contacting system. The simultaneous movement of both types of coupler elements makes the contacting system more simple to control: the coupler elements are contacted and thereby aligned once so that, in principle, the alignment relative to one another does not change. In contrast to this, a continuously changing offset that can affect the transmission quality arises given the movement of coupler elements past one another.

A special type of parallel movement of the coupler elements that is very advantageous because it can be monitored simply and well is that the coil coupler elements and the apparatus coupler elements are coupled with one another in operation by a rolling motion. For example, this can ensue with the use of rollers into which coupler elements are integrated. Such rollers can, for example, be connected in rotation with other rollers in which the respective other coupler elements are contained. In spite of the movement of the coupler elements, a reliable and firm contact that greatly simplifies the contacting for signal transmission advantageously arises via the rolling motion. Intermediate coupler elements such as, for example, additional intermediate coupling rollers can also be used as necessary.

Another form of the contacting through rolling motion ensues with the aid of coil coupler elements and/or apparatus coupler elements that are integrated into a belt, advantageously a continuous belt. Such a belt is preferably fashioned as a flexible circuit board and/or consists of circuit board segments. Such a belt acts as a type of substrate of the respective coupler elements and has the advantage that it can be flexibly directed past guide elements, for example rollers again. If a continuous belt is used, the coupler elements (directed via two guide rollers) respectively always return again to the starting point of their movement and are used for additional contacting passes.

As an alternative to contacting by rolling motion, in another embodiment of a contacting system, that is preferred because it can be simply integrated into a magnetic resonance scanner, the apparatus coupler elements or the coil coupler elements are mounted in the region of a guide recess in which, given a movement during operation, a positively complementary sliding guide element is slid along the movement direction of the movement path, and that the respective other coupler elements are mounted in the region of the sliding guide element. Such a guide recess (for example channel- or groove-like) thus interacts with a (for example) rail or blade-like sliding guide element, wherein one type of interacting coupler element is respectively mounted at the guide recess or, respectively, the sliding guide element. This means that if the coil coupler elements are mounted at the sliding guide element, the apparatus coupler elements interacting with these are suitably arranged in the associated guide recess. The guide recess and the sliding guide element can be mounted on a patient table, for example, in particular on the underside, and if necessary below the patient table in a measurement chamber of the magnetic resonance tomograph. Depending on the design and available space, both the guide recess and the sliding guide element can be localized on the patient table or on the underside. An embodiment with multiple guide recesses and sliding guide elements is also possible, wherein in such a case sliding guide elements can be located on the patient table and the underside of the magnetic resonance tomograph, and respective corresponding guide recesses are arranged at the matching points at the patient table and the underside of the magnetic resonance scanner.

To stabilize the contacting system, in particular to ensure an optimally small and constant distance between the coupler elements, it is very advantageous when the contacting system embodies resilient and/or flexible contact pressure elements to press the apparatus coupler elements onto the coil coupler elements and/or the coil coupler elements onto the apparatus coupler elements. For example, this can ensue with the use of simple pressure springs.

According to the prior art, a separate preamplifier for signal amplification that, for the most part, is integrated into the local coil is associated with every magnetic resonance local coil. Contrary to this, given an increasing number of local coils it is very worthwhile to economize on preamplifiers and to arrange them outside of the field of view. Disruption fields caused by the preamplifiers can hereby no longer have any effect on a magnetic resonance scan.

For this purpose, a preferred embodiment provides preamplifiers that are associated with multiple apparatus coupler elements, particularly preferably in connection with crossover switches to switch preamplifiers between the apparatus coupler elements associated with them. In this way it can be ensured that respectively only one apparatus coupler element is ever contacted with a preamplifier, and in fact advantageously that apparatus coupler element that has a better contact with a coil coupler element than other apparatus coupler elements. It can thus be guaranteed that the best contact connection respectively leads to a signal transmission.

DESCRIPTION OF THE PREFERRED EMBODIMENTS

Figure 1:
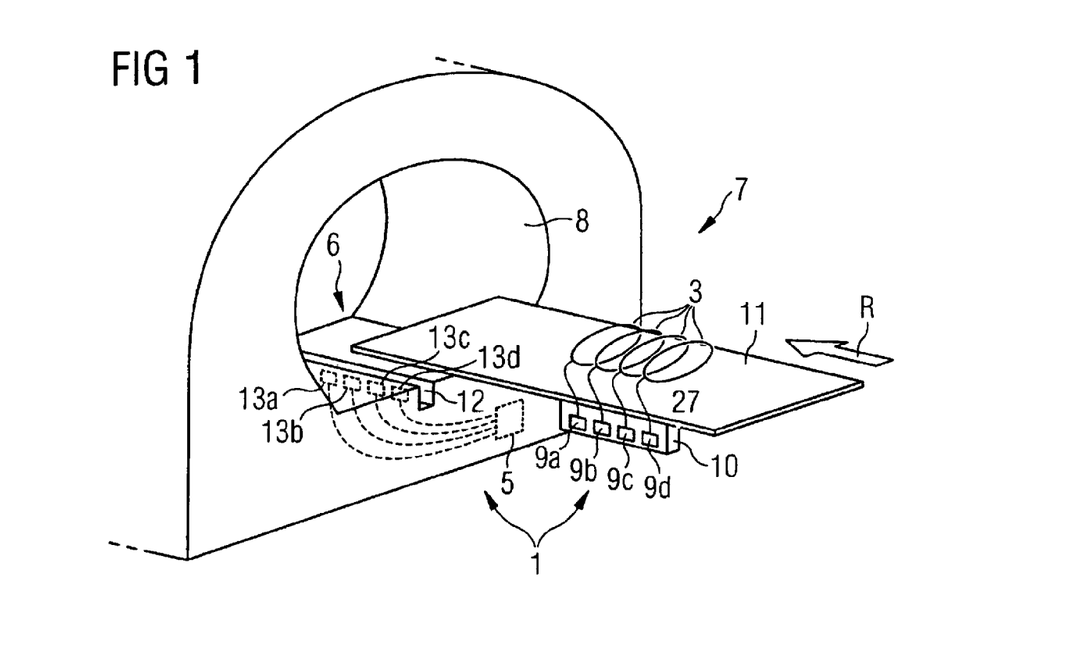
FIG. 1 is a schematic, perspective view of a magnetic resonance scanner according to the invention, with a first exemplary embodiment of a contacting system according to the invention.

FIG. 1 shows in perspective view a magnetic resonance scanner 7 according to the invention, with a subject positioning device 11 and a pt 8. Among other things, a unit for additional signal processing 5 is accommodated inside the housing of the magnetic resonance tomograph 1. Signals from magnetic resonance local coils 3 should arrive at it. This ensues via a contacting system 1 according to the invention that has the following elements:

Induction-based coil coupler elements 9a, 9b, 9c, 9d are housed inside a sliding guide element 10 that is mounted at the subject positioning device 11. Corresponding to this, apparatus coupler elements 13a, 13b, 13c, 13d are localized in the region of a guide recess 12 on the underside 6 of the induction-based magnetic resonance scanner 7. The coil coupler elements 9a, 9b, 9c, 9d are in electrical contact via connection lines 27 with magnetic resonance local coils 3 over a series of plugs (not shown) that are integrated into the positioning device. The magnetic resonance local coils 3 can be placed on the top side of the subject positioning device 11, for example on or below an examination subject. The apparatus coupler elements 13a, 13b, 13c, 13d are in electrical contact with the unit for additional signal processing 5 via connection lines 35.

If the subject positioning device 11 is now conveyed in the provided movement direction R, i.e. here in the direction of the patient space 8, the sliding guide element 10 is inserted into the guide recess 12. An induction contact between the coil coupler elements 9a, 9b, 9c, 9d and the apparatus coupler elements 13a, 13b, 13c, 13d (which are designed in the shape of coils or, respectively, antennas, for example) is thus possible. Measurement signals of the magnetic resonance local coils 3 are hereby inductively transferred. Other coupling elements are successively contacted with one another with the further movement of the subject positioning device 11 and the elements connected with it. A continuous feed of the subject positioning device 11 is thereby possible without signal losses having to occur.

Figure 2:
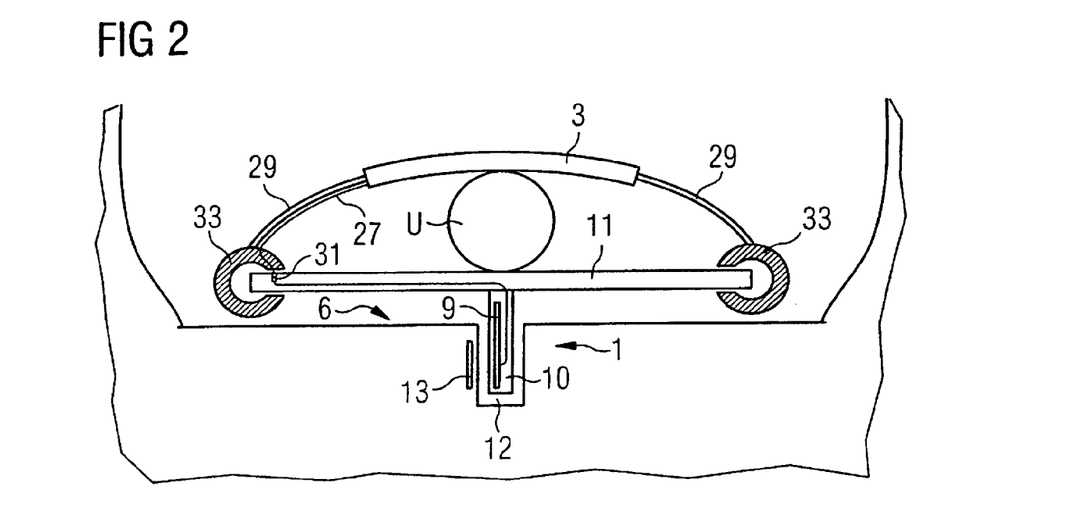
FIG. 2 is a front view of the patient bed region of the magnetic resonance tomograph of FIG. 1.

The arrangement from FIG. 1 is shown in front view in FIG. 2. However, here a few details are added for illustration. For example, it is to be recognized that the magnetic resonance local coils 3 are attached to anchor casings 33 via tension belts 29 spanning an examination subject U, which anchor casings 33 encompass the subject positioning device 11. The connection line 27a that comes from the magnetic resonance local coil 3 is connected via a plug contact 31 with the coil coupler element 9 with a connection line 27b. The magnetic resonance local coils 3 can also be at a distance from the table, or coupled with different coil coupling elements 9.

Figure 3:
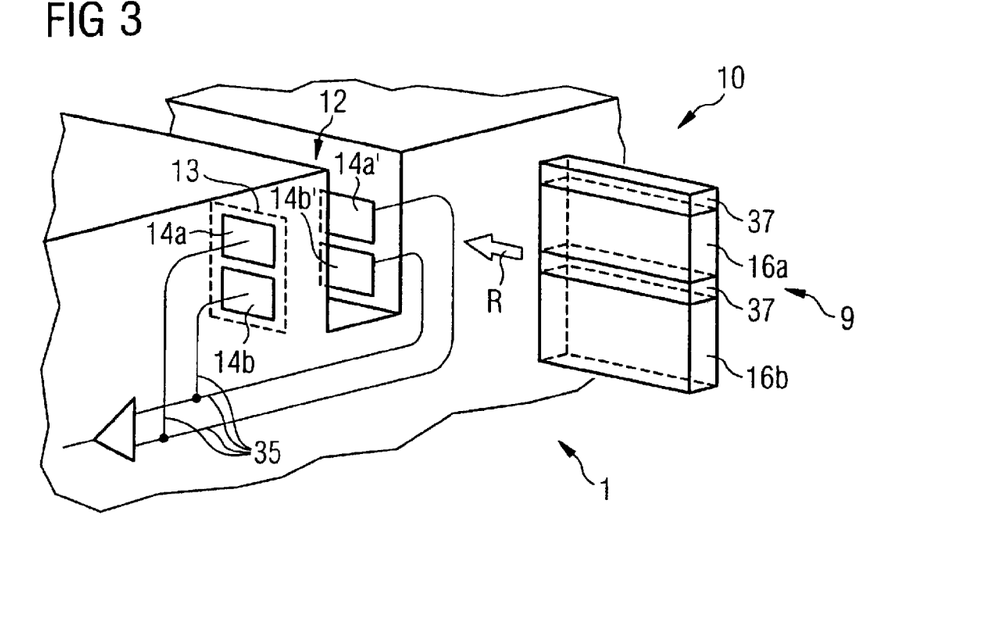
FIG. 3 is a perspective, detail view of a second exemplary embodiment of a contacting system that is slightly modified in comparison to FIG. 1.

FIG. 3 shows a contacting system 1 that is varied in one significant point in comparison to FIG. 1: the shown apparatus and coil coupler elements 9 or, respectively, 13 are fashioned as capacitive coupler elements. They therefore comprise capacitor plates. The coil coupler element 9 consists of two capacitor plates 16a, 16b that lie atop one another in one plane and are separated from one another by insulators 37.

Figure 4:
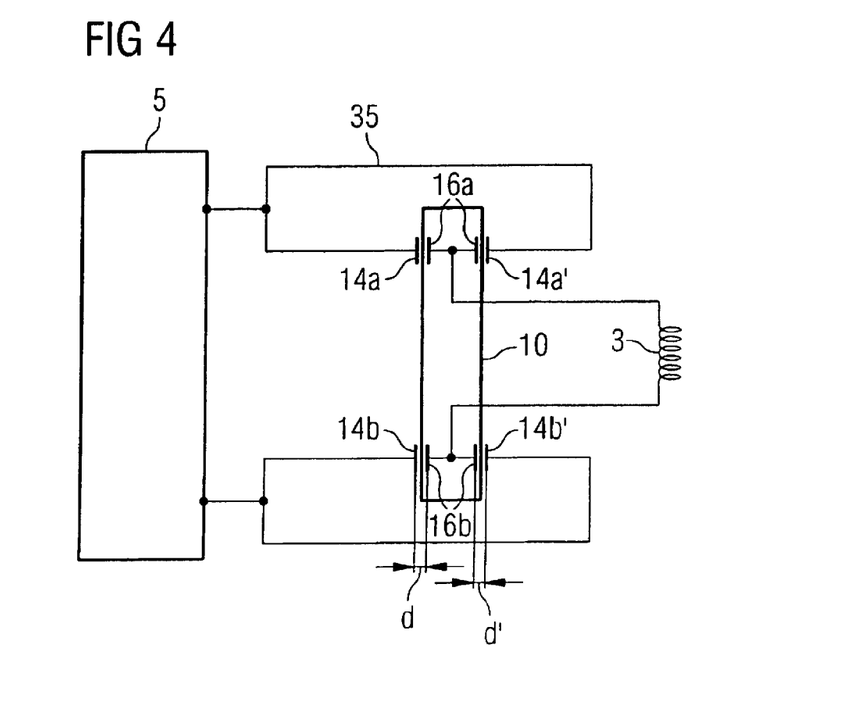
FIG. 4 is a schematic circuit diagram of the exemplary embodiment shown in FIG. 3.

The apparatus coupler element 13 consists of two counter capacitor plates 14a, 14a' or, respectively, 14b, 14' that are each associated with one of the capacitor plates 16a, 16b. The counter capacitor plates 14a, 14a' and 14b, 14' are arranged on both sides of the guide recess 12, and the respective oppositely situated counter capacitor plates 14a, 14a' or, respectively, 14b, 14' are connected in parallel by means of the connection lines 35. The capacitor surfaces or, respectively, lateral surfaces of the capacitor plates 16a, 16b (and associated counter capacitor plates 14a, 14a' and 14b, 14') that are situated at the same level respectively form a capacitor pair connected [wired] in parallel. FIG. 4 shows a schematic circuit diagram in this regard with indicated sliding guide element 10.

This design has the following effect: if the sliding guide element 10 is directed in the movement direction R via the guide recess 12, a contacting arises via coupling of the coil coupler element 9 on both of its flat sides. Due to the parallel wiring of the corresponding counter capacitor plates 14a, 14a' and 14b, 14', the signals received there are added up into a signal that is essentially independent of the precise maintenance of a specific position of the sliding guide element 10 in the guide recess 12 transversal to the movement direction R.

In particular the distances d, d' between the two sides of the capacitor plates 16a, 16b (which are respectively represented in the circuit diagram as two capacitor surfaces connected with one another and with one end of the local coil 3) and the counter capacitor plates 14a, 14a' and 14b, 14' are recognizable in FIG. 4. The counter capacitor plates 14a, 14a' and 14b, 14' wired in parallel are respectively connected to a unit for additional signal processing 5 so that each end of the local coil 3 is connected via one capacitor pair to an input of the unit for additional signal processing 5. A capacitor surface of the capacitor plates 16a, 16b together with the counter capacitor plates 14a, 14a' and 14b, 14' respectively opposite it forms a capacitor of the capacitor pair whose capacitance depends on, among other things, the distance d, d' between the opposite capacitor surfaces or, respectively, plates. However, the signal transmission is adulterated by a variation of the capacitance. However, since the capacitors at each level (the capacitors shown above and the capacitors shown below in FIG. 4), i.e.

the capacitors of a capacitor pair, are respectively connected in parallel, only the total distance between the associated capacitor surfaces or, respectively, plates is relevant (i.e. d+d') to the total capacitance of the capacitors connected in parallel. However, this total distance does not change given a displacement of the sliding guide element 10 transversal to the movement direction R since every variation of the distance on one side inevitably entails a counteracting variation of the distance on the other side. A significant problem given a moved capacitive coupling is thereby circumvented, namely that an exactly constant distance between capacitive coupler elements does not actually have to be ensured in order to optimally guarantee a signal reception.

Figure 5:
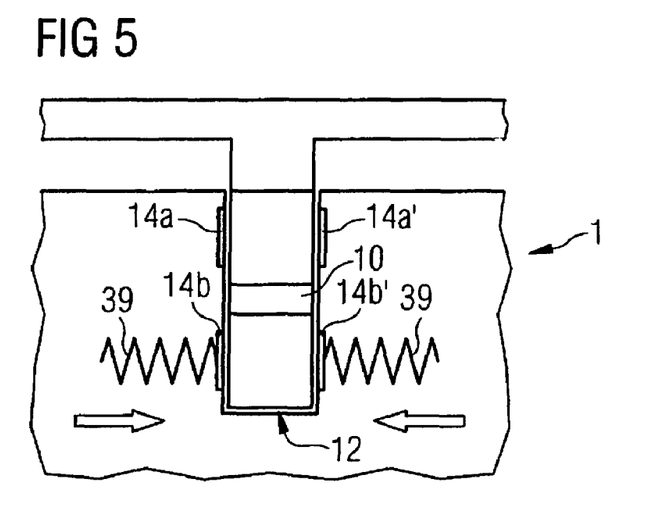
FIG. 5 is a schematic cross section through a contacting system similar to that in FIG. 3.

FIG. 5 shows a further solution possibility for keeping the capacitance of the capacitors formed by the coupler elements constant. A contacting system 1 that is designed similar to that from FIG. 3 is shown in a front view. In addition to the aforementioned elements, springs 39 are arranged here on both sides of the guide recess 12, which springs 39 press the walls of the guide recess 12 (which walls here are fashioned to be movable) and counter capacitor plates 14a, 14a' and 14b, 14' connected with these in the direction of the sliding guide element 10 so that a predefined distance between the coil coupler element 9 and the counter capacitor plates 14a, 14a' and 14b, 14' that is advantageously equal to zero can be maintained. In order to thereby avoid a galvanic contact, the counter capacitor plates 14a, 14a' and 14b, 14' are countersunk into the wall of the guide recess 12, or must at least have a coating insulating them from the coil coupler element 9.

Figure 6:
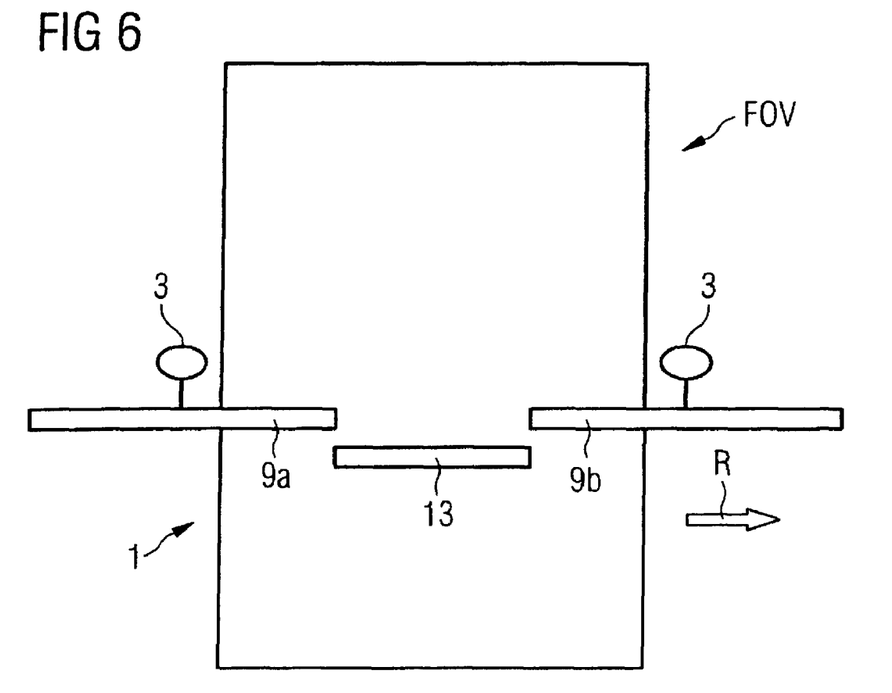
FIG. 6 is a basic representation of a contacting of coupler elements according to a third embodiment of the invention.

In a schematic principle design, FIG. 6 shows the passage of a magnetic resonance local coil 3 through the acquisition region FOV of a magnetic resonance tomograph. Coil coupler elements 9a, 9b are connected with the magnetic resonance local coils 3. An apparatus coupler element 13 is firmly attached in the acquisition region FOV.

The coupler elements 9a, 9b, 13 are now advantageously dimensioned or, respectively, arranged in space so that, given a movement in the movement direction R, the respective coil coupler element 9a, 9b comes into contact with the apparatus coupler element 13 or, respectively, this contact is ended upon the magnetic resonance local coils 3 entering into or, respectively, exiting from the acquisition region FOV. As is apparent, for this it is not necessary that the coil coupler elements 9a, 9b are equal in size to the apparatus coupler element 13, or to the acquisition region of the magnetic resonance local coils 3.

Figure 7:
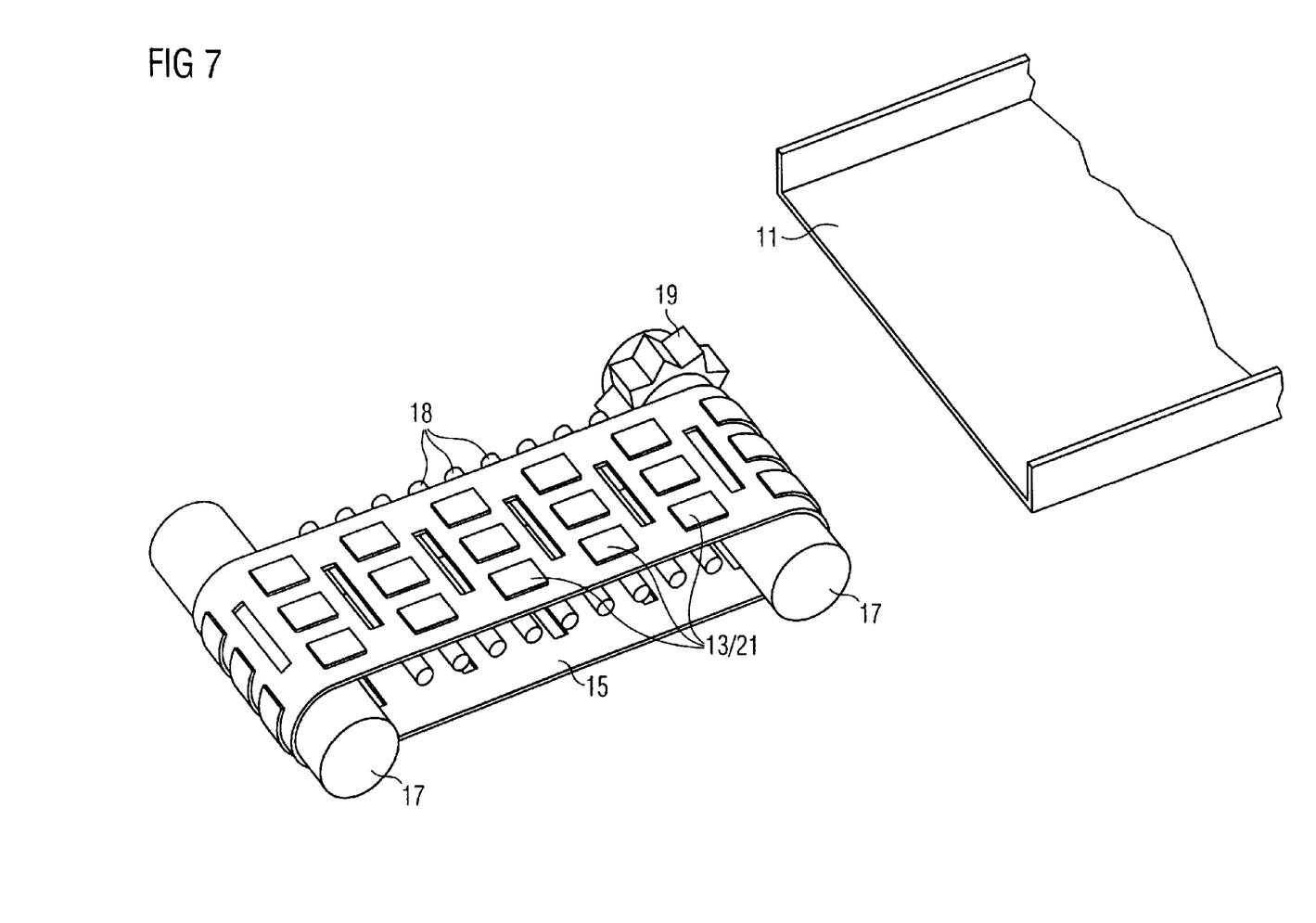
FIG. 7 is a perspective view, from above and at an angle, of a subject positioning device and elements of a contacting system according to the invention according to a fourth embodiment.

FIG. 7 shows a particularly preferred embodiment of the invention in a perspective view from above. A subject positioning device 11 is hereby momentarily directed via a revolving continuous belt 15.

This continuous belt 15 is deflected via two deflection rollers 17 and directed by guide rollers 18. It has circuit board segments 21 as apparatus coupler elements 13. These circuit board segments are contacted via cables (not shown) with a unit for additional signal processing 5 (not shown). During a movement of the continuous belt, these cables are wound or unwound and thus perform the movement as well. The cable length is tailored depending on the dimensioning of the entire arrangement, i.e. depending on the total required unwound length, which in turn depends on the maximum travel distance of the subject positioning device and the length of the continuous belt. It advantageously corresponds to a length composed of two to three revolutions of the continuous belt 15. The continuous belt 15 is driven via the right of the two deflection rollers 17, which for this purpose is provided with a gearwheel 19.

Figure 8:
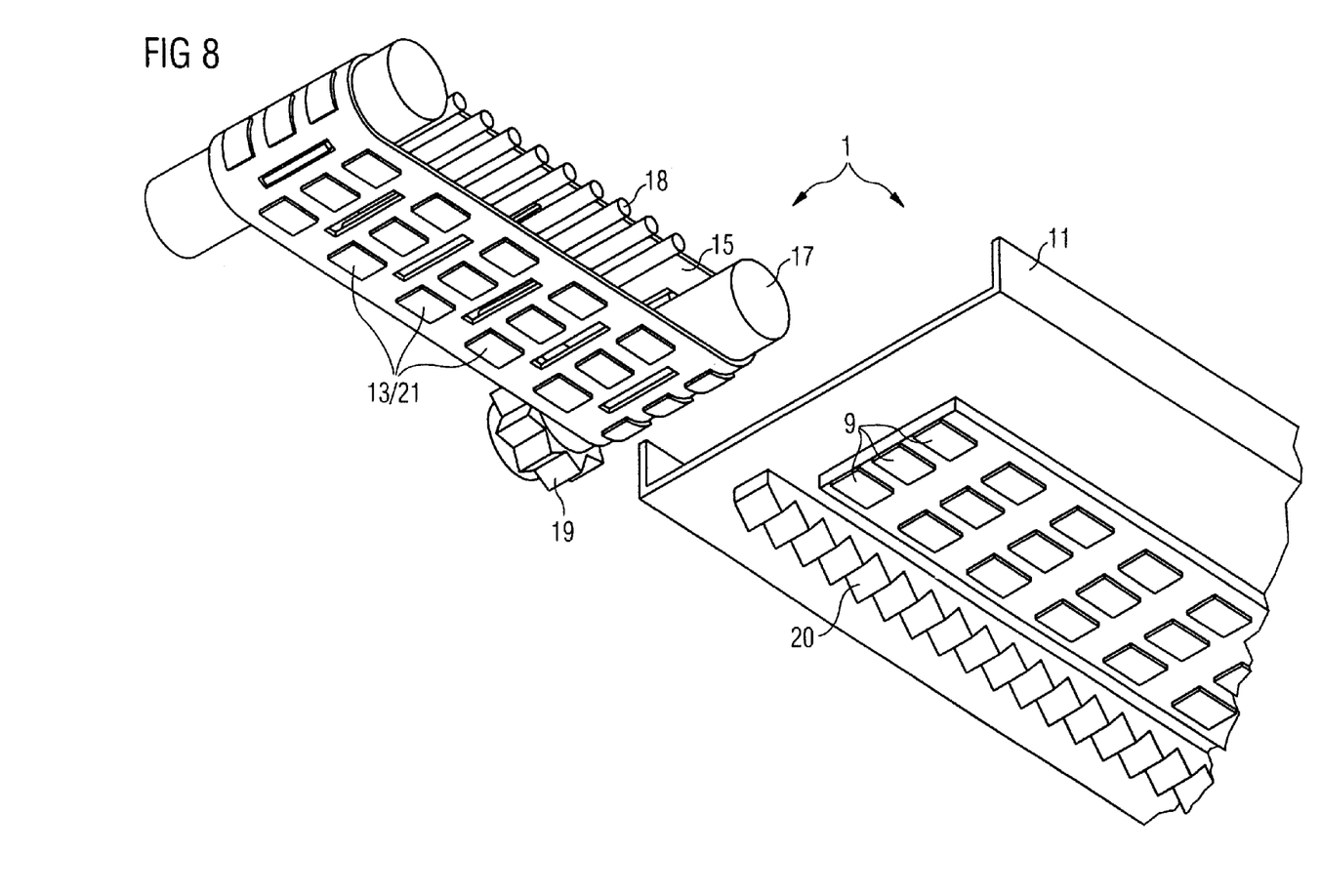
FIG. 8 is a perspective view, from below and at an angle, of the same elements as in FIG. 7.

FIG. 8 shows the arrangement from FIG. 7 in a view from the underside. It is recognizable that a structure complementary to the continuous belt 15 exists on the underside of the subject positioning device 11: on the one hand, coil coupler elements 9 are mounted there that are connected via connection lines 27 (not shown) with magnetic resonance local coils; on the other hand, the subject positioning device 11 has a rack on the underside.

If the subject positioning device 11 is directed by the continuous belt 15, the following workflow results: the first row of coil coupler elements 9 is contacted with a series of apparatus coupler elements 13. At the same time, the teeth of the gearwheel 19 and steering rack 20 engage with one another, whereby the one of the two deflection rollers 17 rotates and the continuous belt 15 is moved along. A simultaneous movement of the coil coupler elements 9 and apparatus coupler elements 13 arises up to the point at which the first series of coil coupler elements 9 is automatically separated from the continuous belt 15 via its deflection around the second deflection roller 17. An entrainment of both coupler elements 9, 13 and a contacting by means of unrolling thus results.

Figure 9:
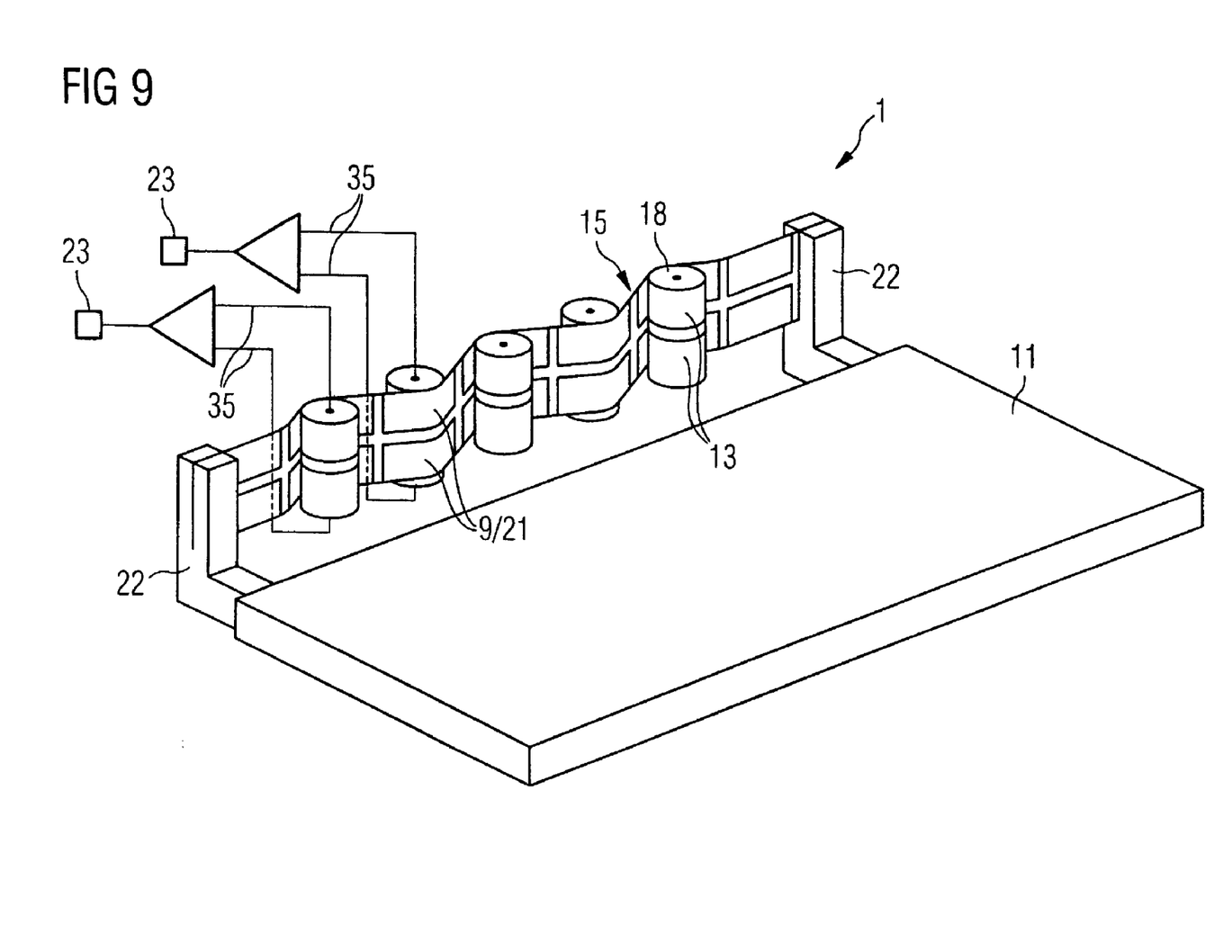
FIG. 9 is a perspective, principle view of a contacting system according to a fifth embodiment of the invention.

A similar type of contacting system 1 is shown in FIG. 9. Here as well a belt 15 is used that, however, bears the coil coupler elements 9 and is connected via belt retainers 22 with a subject positioning device 11. The representation of a lateral attachment of such a belt 15 serves for a better presentation capability; it can also be arranged at another point, advantageously below the subject positioning device 11. The apparatus coupler elements 13 are integrated into guide rollers 18 that are attached at fixed positions in the magnetic resonance tomograph such that they can rotate around their axes and between which the belt 15 is alternately threaded. Signals transmitted via the coupler elements 9, 13 arrive via connection lines 35 in preamplifier 23, which amplifies them for relaying to a unit for additional signal processing.

In contrast to the embodiment shown in FIG. 8, the arrangement of coil coupler elements 9 and apparatus coupler elements 9 is swapped, and on the other hand it is not a continuous belt that is used; rather, the unrolling for contacting purposes ensues via an essentially linear movement of the belt 15.

Figure 10:
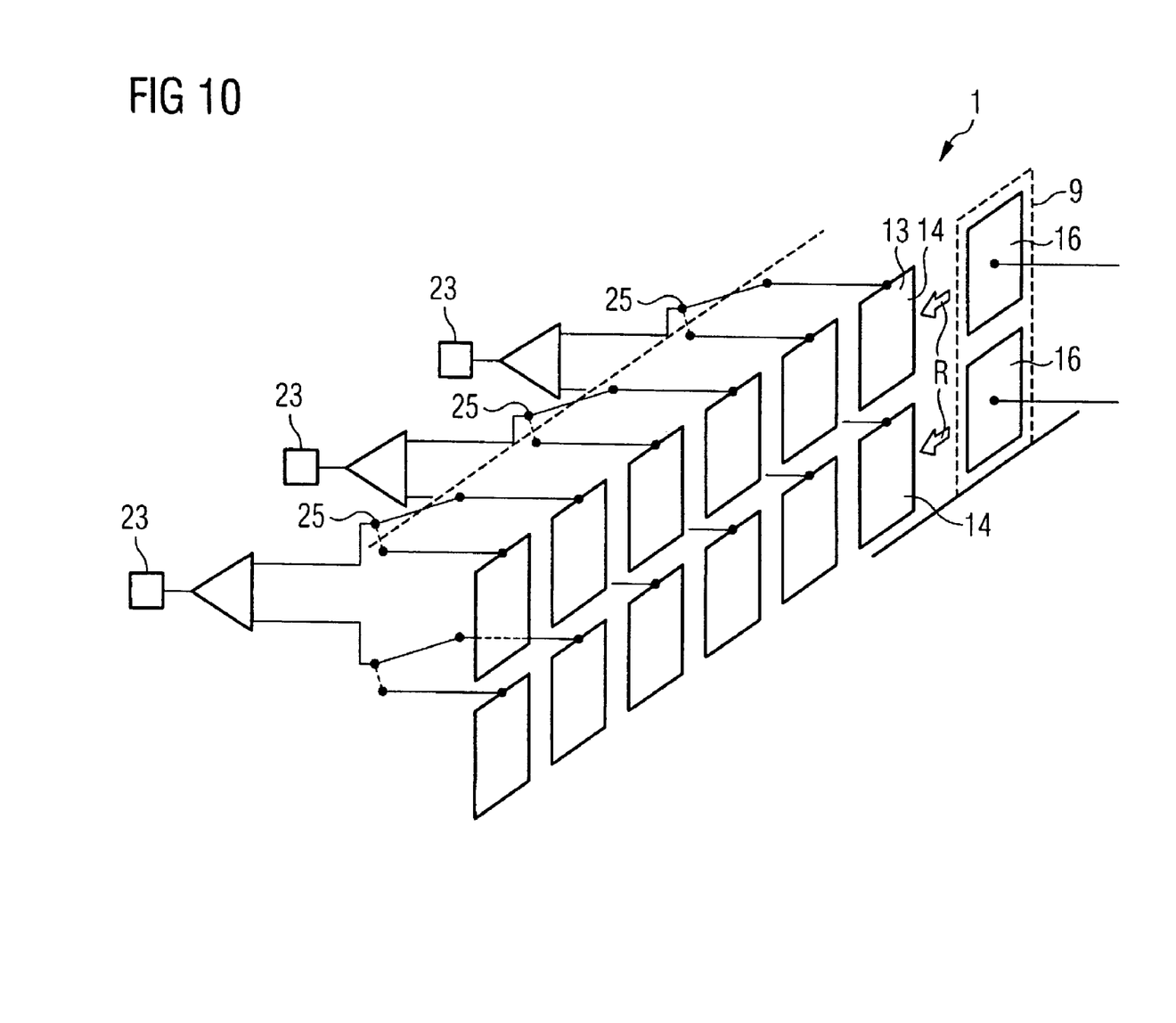
FIG. 10 is a basic representation of the association of coupler elements with selected preamplifiers according to a sixth embodiment of the invention.

FIG. 10 shows the principle of another embodiment of a contacting system 1 according to the invention as in FIGS. 3 and 4. Coil coupler elements 9 are directed along a series of apparatus coupler elements 13 and successively, capacitively contacted with them. A common preamplifier 23 is associated with a pair of apparatus coupler elements 13 positioned next to one another in the movement direction R. In order to be able to use this system, crossover switches 25 are provided that switch back and forth between a coupling of a preamplifier 23 with the first apparatus coupler element 13 and the second apparatus coupler element 13. For the crossover switch, which of the two associated apparatus coupler elements 13 has a better contact with the coil coupler element 9 is thereby a criterion for switching over. In practice, for the most part this means that the coverage of an apparatus coupler element 13 with the coil coupler element 9 is greater than with the other one. The signals that can best be transmitted are hereby always amplified.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
   a magnetic resonance data acquisition unit configured to acquire magnetic resonance data from an examination subject interacting with the magnetic resonance data acquisition unit;
   a plurality of local coils in said magnetic resonance data acquisition unit that participate in said acquisition of magnetic resonance data by transmitting radio frequency signals into, and/or receiving magnetic resonance signals from, the examination subject;
   each of said magnetic resonance local coils having a coil coupler element electrically connected thereto and mounted in said magnetic resonance data acquisition unit;
   a signal processor in said magnetic resonance data acquisition unit remote from said local coils;
   a plurality of apparatus coupler elements mounted in said magnetic resonance data acquisition unit that are electrically connected to said signal processing unit;
   a moveable element, on which said local coils are carried, that moves in a movement path in said magnetic resonance data acquisition unit; and
   said coil coupler elements being disposed on said moveable element, and said apparatus coupler elements being disposed in said magnetic resonance data acquisition unit, to cause at least some of said coil coupler elements to successively couple, for signal transmission, at least some of said apparatus coupler elements at least within a segment of said movement path.

2. A magnetic resonance apparatus as claimed in claim 1 wherein said moveable element is a positioning device configured to position said subject in said magnetic resonance data acquisition unit.

3. A magnetic resonance apparatus as claimed in claim 1 wherein said magnetic resonance data acquisition unit has a data acquisition region therein, and wherein said apparatus coupler elements are disposed relative to said coil coupler elements to cause said at least some of said coil coupler elements that are coupled with said at least some of said apparatus coupler elements in said segment to be coil coupler elements that are connected to respective local coils that are currently in said data acquisition region.

4. A magnetic resonance apparatus as claimed in claim 3 wherein said coil coupler elements and said apparatus coupler elements are disposed relative to each other to cause respective coil coupler elements to coupled respective apparatus coupler elements immediately preceding entry of the local coil connected to that coil coupler element into said acquisition region.

5. A magnetic resonance apparatus as claimed in claim 3 wherein said coupler elements and said apparatus coupler elements are disposed relative to each other to disconnect coupling of a respective coil coupler element with a respective apparatus coupler element immediately upon the local coil connected to that respective coil coupler element exiting said acquisition region.

6. A magnetic resonance apparatus as claimed in claim 1 wherein each of said coil coupler elements and the respective local coil connected thereto lie on a vertical line proceeding perpendicularly to said movement path.

7. A magnetic resonance apparatus as claimed in claim 1 wherein said coil coupler elements and said apparatus coupler elements are configured to produce said coupling in a manner selected from the group consisting of galvanic contacting, capacitive coupling and inductive coupling.

8. A magnetic resonance apparatus as claimed in claim 1 wherein said coil coupler elements and said apparatus coupler elements respectively comprise capacitor plates operating in parallel to form a capacitor group, with the capacitor plate of each coil coupler element and the capacitor plate of an oppositely situated apparatus coupler element forming a capacitor in said capacitor group, the capacitors in the respective capacitor groups being located relative to each other to cause a capacitor change of a capacitor in the capacitor group, produced by movement of said moveable element, is compensated by another capacitor change of at least one other capacitor in the same capacitor group.

9. A magnetic resonance apparatus as claimed in claim 1 wherein said moveable element is mounted on rollers for movement along said movement path in said magnetic resonance data acquisition unit.

10. A magnetic resonance apparatus as claimed in claim 1 wherein either said coil coupler elements or said apparatus coupler elements are integrated to a belt as said moveable element.

11. A magnetic resonance apparatus as claimed in claim 10 wherein said belt is formed as a flexible circuit board.

12. A magnetic resonance apparatus as claimed in claim 11 wherein said flexible circuit board is comprised of a plurality of circuit board segments.

13. A magnetic resonance apparatus as claimed in claim 1 wherein either said apparatus coupler elements or said coil coupler elements are mounted in a guide recess in which said moveable element moves in said movement path, and wherein the other of said apparatus coupler elements or said coil coupler elements are mounted on a sliding guide element that moves in said guide recess with said moveable element.

14. A magnetic resonance apparatus as claimed in claim 1 wherein said apparatus coupler elements are resilient contact elements that, press onto respective coil coupler elements during movement of said moveable element in said movement path.

15. A magnetic resonance apparatus as claimed in claim 1 wherein multiple ones of said apparatus coupler elements are connected to preamplifiers.

16. A magnetic resonance apparatus as claimed in claim 15 comprising a plurality of switches that switch said preamplifiers among said apparatus coupler elements.

17. A method for operating a magnetic resonance apparatus comprising the steps of:
   operating a magnetic resonance data acquisition unit configured to acquire magnetic resonance data from an examination subject interacting with the magnetic resonance data acquisition unit, using a plurality of local coils in said magnetic resonance data acquisition unit that participate in said acquisition of magnetic resonance data to transmit radio frequency signals into, and/or receive magnetic resonance signals from, the examination subject;
   providing each of said magnetic resonance local coils with a coil coupler element electrically connected thereto and mounted in said magnetic resonance data acquisition unit;
   electrically connecting a plurality of apparatus coupler elements mounted in said magnetic resonance data acquisition unit to a signal processing unit remotely located in said magnetic resonance data acquisition unit from said local coils;
   moving said local coils in a movement path in said magnetic resonance data acquisition unit; and
   disposing said coil coupler elements on said moveable element, and disposing said apparatus coupler elements in said magnetic resonance data acquisition unit to cause at least some of said coil coupler elements to successively couple, for signal transmission, at least some of said apparatus coupler elements at least within a segment of said movement path.

18. A method as claimed in claim 16 comprising continuously moving said local coils together with said coil coupler elements in said magnetic resonance data acquisition unit.

19. A method as claimed in claim 17 comprising continuously moving said apparatus coupler elements in said magnetic resonance data acquisition unit.

20. A method as claimed in claim 17 comprising moving both said local coil elements and said apparatus coupler elements relative to each other.

21. A method as claimed in claim 17 comprising moving said coil coupler elements and said apparatus coupler elements with each other uniformly.

22. A method as claimed in claim 17 comprising producing said coupling in a manner selected from the group consisting of galvanic contacting, capacitive coupling and inductive coupling.

* * * * *